United States Patent [19]
Bergemont

[11] Patent Number: 5,246,874
[45] Date of Patent: Sep. 21, 1993

[54] METHOD OF MAKING FAST ACCESS AMG EPROM

[75] Inventor: Albert Bergemont, Santa Clara, Calif.

[73] Assignee: National Semiconductor Corporation, Santa Clara, Calif.

[21] Appl. No.: 892,502

[22] Filed: Jun. 2, 1992

[51] Int. Cl.$^5$ ............................................. H01L 21/70
[52] U.S. Cl. ........................................ 437/52; 437/43; 437/48; 437/50
[58] Field of Search ....................... 437/43, 48, 50, 52, 437/195; 357/315

[56] References Cited

U.S. PATENT DOCUMENTS

| | | | |
|---|---|---|---|
| 4,822,750 | 4/1989 | Perlegos et al. | 437/52 |
| 4,851,365 | 7/1989 | Jeuch | 437/43 |
| 5,081,054 | 1/1992 | Wu et al. | 437/43 |
| 5,120,670 | 6/1992 | Bergmont | 437/43 |

Primary Examiner—Tom Thomas
Attorney, Agent, or Firm—Limbach & Limbach

[57] ABSTRACT

A fast access EPROM array formed in a silicon substrate of P-type conductivity comprises a layer of gate oxide formed on the silicon substrate. A first layer of polysilicon is formed on the gate oxide. A layer of oxide/nitride/oxide composite is formed on the first polysilicon layer. The ONO and underlying Poly1 define a plurality of parallel strips. N-type dopant introduced into the silicon substrate between the ONO/Poly1 strips define buried N+ bit lines. Alternate buried N+ bit lines to define drain lines that alternate with buried N+ source lines. Each of the drain lines is contacted only once for a plurality of EPROM cells sharing that drain line such that the EPROM array is subdivided into a plurality of segments. The source lines are uncontacted. A plurality of Poly2 wordlines are formed perpendicular to the ONO/Poly1 strips such that an intersection of the Poly2 word lines and the Poly1 floating gate define the location of a cross-point EPROm cell of the array. Each segment of the array include first and second Poly2 select lines the intersection of which with the Poly1 defines first and second select transistors such that each buried N+ source line is electrically connectable to one of its adjacent drain lines via the first select transistor and to the other adjacent drain line via the second select transistor. Finally, each segment also includes a segment select line that defines the gate of a segment select transistor associated with each drain line.

1 Claim, 8 Drawing Sheets

METHOD OF MAKING FAST ACCESS AMG EPROM

BACKGROUND OF THE INVENTION

1. Field of the Invention

The present invention relates to electrically programmable read only memory (EPROM) devices and, in particular, to an alternate metal virtual ground (AMG) EPROM array that incorporates segment select lines to provide enhanced read access speed.

2. Discussion of the Prior Art

U.S. patent application Ser. No. 539,657, filed by Boaz Eitan on Jun. 13, 1990 for EPROM VIRTUAL GROUND ARRAY, teaches a "contactless" EPROM cell array and its associated process flow. Eitan's contactless concept is attractive because it allows high density EPROMs to be fabricated without using aggressive fabrication technologies and design rules.

The basic idea of the Eitan disclosure is the use of a "cross-point" EPROM cell, i.e. a cell which is defined by the crossing of a perpendicular poly 1 floating gate and poly 2 word lines in a virtual ground array. In order to avoid drain turn-on, i.e. electron leakage from unselected cells on the same bit line as a selected cell, metal contacts silicon every two drain bit lines and the non-contacted source bit lines are connected to Vss only via an access transistor. Additionally, in the Eitan architecture, each bit line is contacted once every 64 cells, each block of 64 cells on the same bit line constituting 1 segment. Thus, when programming a particular cell, only one 64 cell segment need be addressed; all other segments are "off" and, therefore, the cells in these unselected segments are not susceptible to leakage.

However, there are several drawbacks associated with the Eitan process flow. First, five layers of processing are required over the poly 1 floating gate layer: oxide/nitride/oxide/poly cap/nitride. The poly 1 and the five overlying layers are defined twice, once at the poly 1 mask step and once at the poly 1 island mask step. These two etching steps are very critical because they define, respectively, the length and width of the EPROM cell. The requirement to etch more layers in these steps presents difficulties in controlling these critical dimensions. Also, failing to remove any one of the five layers presents the risk of poly 1 stringers along the edges of the field oxide. These edges are located in the neighborhood of the access transistors.

Furthermore, because the poly 2 word line in the Eitan array is not self-aligned with the poly 1 floating gate, a special "array field implant" is required to avoid leakage between adjacent bit lines. This leakage occurs when poly 2 is misaligned with poly 1. The poly 2 controls one part of the silicon and leads to a parasitic poly 2 transistor between adjacent bit lines. For this reason, a high threshold voltage is required to avoid the turn on of this parasitic poly 2 transistor. This is done using an array boron field implant.

In addition to the boron field implant, the Eitan process also calls for an "isolation oxide" to move the field threshold to a sufficiently high voltage. This field implant leads to boron lateral diffusion into the channel of the cell, leading to channel width reduction, high bit line loading and reduction of the bit line/substrate breakdown voltage.

Additionally, the poly 2 etch is very critical in the Eitan process. The poly 2 etching terminates on a poly cap. In order to maintain the coupling ratio, it is necessary to stop the etch within a nominal poly cap thickness. This is difficult from the point of view of overetched latitude with a thin poly cap layer. Depending on the thickness of the isolation oxide, poly 1 to poly 2 misalignment will affect the parasitic capacitance of the word lines.

Furthermore, removing the top nitride before depositing the poly 2 word line may affect the quality of the oxides all around the poly 1 floating gate. This could affect program disturb and data retention.

U.S. patent application Ser. No. 07/830,938, filed Feb. 4, 1992 by Albert Bergemont for ALTERNATE METAL/SOURCE VIRTUAL GROUND FLASH EPROM CELL ARRAY, which application is commonly assigned herewith; discloses a novel contactless flash EPROM array architecture that provides reduced cell size and ease of scalability while retaining the programming and erase simplicity of conventional flash EPROMs.

The Bergemont contactless flash EPROM array utilizes cross-point cells formed in a P-type silicon substrate. The array comprises a layer of gate oxide formed on a P-type silicon substrate. Parallel strips of oxide/nitride/oxide (ONO) and underlying first polysilicon (Poly1) are formed on the gate oxide, the Poly1 providing the floating gates for the cells of the array. Buried N+ bit lines are formed in the substrate between the ONO/Poly1 strips. Alternate buried N+ bit lines have additional N-type dopant introduced thereto to form graded source lines that alternate with buried N+ drain lines. The graded source bit lines are contacted by metal in segmented fashion, i.e. there is only one source contact for every 32 or 64 cells in a given column of the EPROM array. The intermediate buried N+ drain lines are uncontacted. The array's Poly2 word lines are formed perpendicular to the ONO/Poly1 strips such that the word lines are separated from the Poly1 floating gates by the ONO to define "cross-point" cells. Each buried N+ drain line is electrically connectable to one of its adjacent graded source lines via a first select transistor that has its gate provided by a first Poly2 select line and to the other adjacent graded source line via a second select transistor that has its gate provided by a second Poly2 select line. The first and second select transistors are also cross-point flash EPROM cells defined by intersection of Poly2 select lines and the N+ bit lines.

A selected cell in the Bergemont array is programmed by maintaining the cell's word line at the programming voltage. The first adjacent graded source line is maintained at a high voltage, while the second adjacent graded source line is maintained at a low voltage. A high voltage level is then applied to the first select line while the second select line is held at the low voltage level to pull up the high voltage on the intermediate non-contacted drain bit line. Thus, electrons channel from the buried N+ drain line of the selected cell to its floating gate.

The Bergemont array is erased by applying an erase voltage to each of the graded source lines and holding both the first select line and the second select line at the low voltage level. Thus, for each programmed flash EPROM cell in the array, electrons tunnel from the floating gate of the cell to the graded source.

U.S. patent application Ser. No. 07/892259, filed by Albert Bergemont of even date herewith for SEGMENT-ERASABLE FLASH EPROM, which application is commonly-assigned herewith, adds segment select lines to the flash EPROM array described in the Bergemont application Ser. No. 07/830,938 for isolating segments of the array during read and erase operations. This results in reduced bit line capacitance during read operations and, thus, faster read access. It also enables true segment erase in a flash EPROM array.

SUMMARY OF THE INVENTION

A preferred embodiment of the present invention provides an alternate metal virtual ground (AMG) EPROM array formed in a silicon substrate of P-type conductivity. The EPROM array comprises a layer of gate oxide formed on the silicon substrate. A first layer of polysilicon is formed on the gate oxide. An oxide/nitride/oxide composite is formed on the first polysilicon layer. The ONO and underlying Poly1 define parallel strips, the Poly1 providing the floating gates of the cells in the array. N-type dopant introduced into the silicon substrate between the ONO/Poly1 strips defines buried N+ bit lines. Alternate buried N+ bit lines define N+ drain lines that are adjacent intermediate buried N+ source bit lines. Each of the drain lines is contacted only once for a plurality of EPROM cells sharing that particular drain line, thus subdividing the EPROM array into a plurality of segments. The intermediate drain bit lines are uncontacted. Poly2 word lines are formed perpendicular to the ONO/Poly1 strips such that the intersection of a Poly2 word line and a Poly1 strip defines the location of a cross-point EPROM cell. Each segment of the array includes first and second Poly2 select lines, the intersection of which with the Poly1 defines first and second select transistors such that each buried N+ source line is electrically connectable to one of its adjacent drain lines via the first select transistor and to the other adjacent drain line via the second select transistor. Finally, and in accordance with the present invention, each segment in the array also includes first and second segment select lines that define the gate of segment select transistors located at opposite ends of each drain line in the segment. The segment select transistors are utilized to designate a specified segment(s) in the array for read operations. This results in reduce bit line capacitance during read operations and, thus, faster read access.

A better understanding of the features and advantages of the present invention will be obtained by reference to the following detailed description and accompanying drawings which set forth an illustrative embodiment in which the principals of the invention are utilized.

DETAILED DESCRIPTION OF THE INVENTION

A process methodology will now be described for fabrication of an alternate metal virtual ground (AMG) EPROM cell array in accordance with the concepts of the present invention. The array utilizes cross-point cells with internal access transistors.

FIGS. 1-6 illustrate the sequential steps in a process flow for fabricating an EPROM array in accordance with the present invention. Each of FIGS. 1-4 includes a plan view of a portion of the array structure at that stage of the process flow and the following three corresponding cross-sectional views in the structure: (1) in the word line direction in the EPROM cell array (designated "A/A"), (2) in the word line direction in the select transistor area (designated "B/B"), and (3) in the Poly1 direction perpendicular to the word line in the select transistor area (designated "C/C"). In addition, FIGS. 2-4 include a cross-sectional view of the structure in the N+ drain direction to show the segment select transistor area (designated "D/D"). The FIG. 5-6 cross-sectional views show details of the segment select transistor area.

Figure 1:
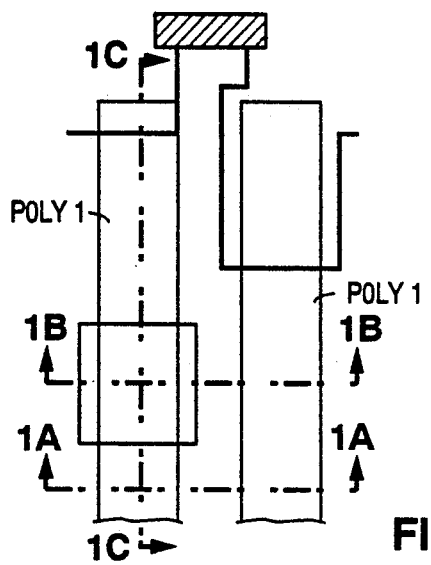
FIG. 1-6 illustrate sequentially a process flow for fabricating a fast access EPROM array in accordance with the present invention.
Figure 1A:
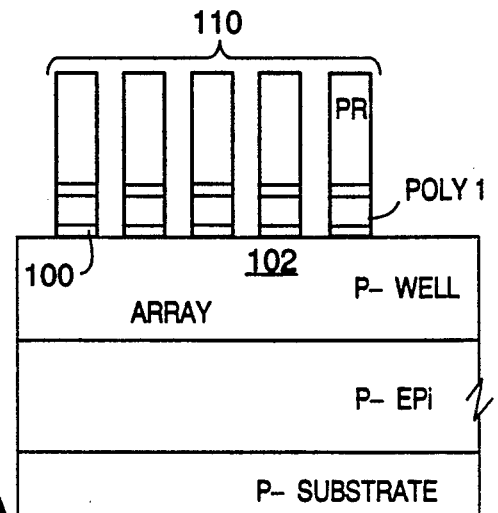
Figure 1B:
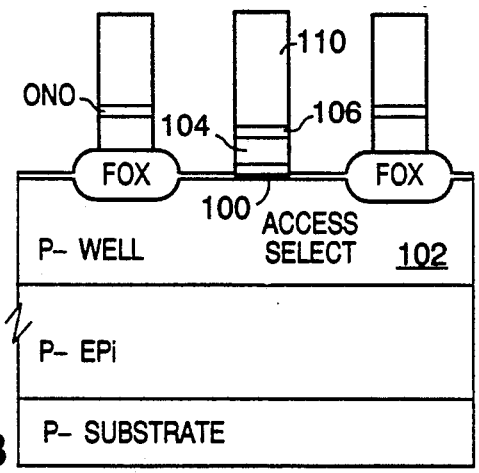
Figure 1C:
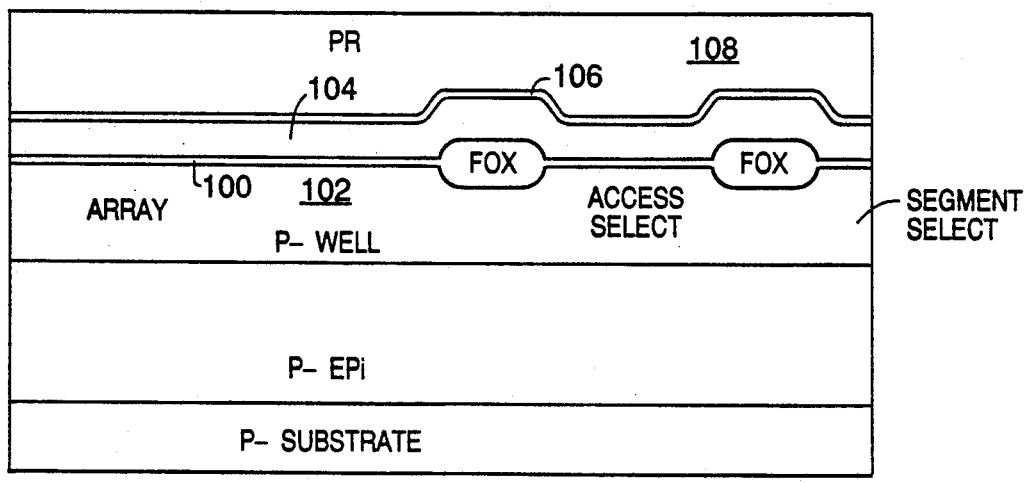

Referring to FIG. 1, the process flow begins with conventional steps common to this type of process and, then, with the formation of a 100 Å gate oxide 100 on a P-type silicon substrate 102. A layer of polysilicon (Poly1) 104 is then deposited to a thickness of about 1,500 Å and doped with phosphorus at a dose of $2-5\times10^{15}$ at low implant energy.

Next, as further shown in FIG. 1, a composite dielectric layer of oxide/nitride/oxide (ONO) 106 is formed on the Poly1. After growing this ONO layer, a photoresist mask 108 is used to define strips on the ONO. The ONO 106 and underlying Poly1 104 are then plasma etched to form parallel strips 110 of ONO/Poly1.

Figure 2:
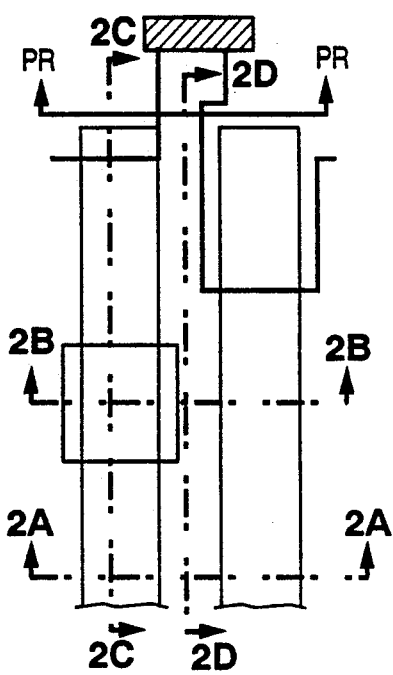
Figure 2A:
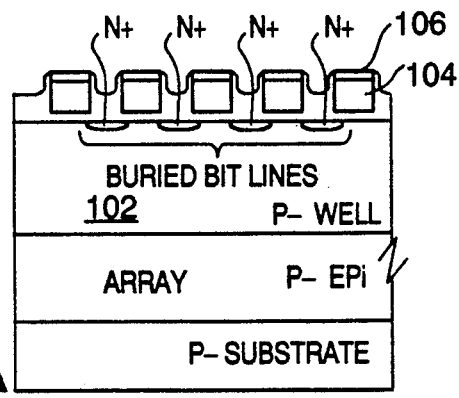
Figure 2B:
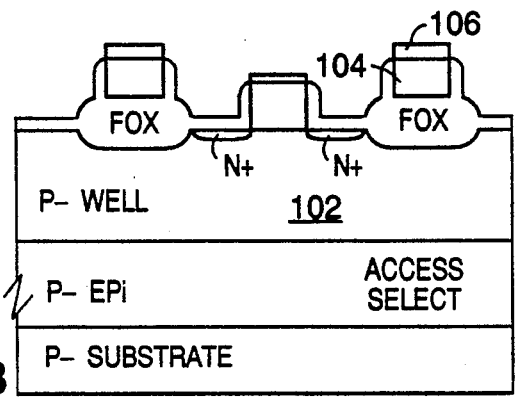
Figure 2C:
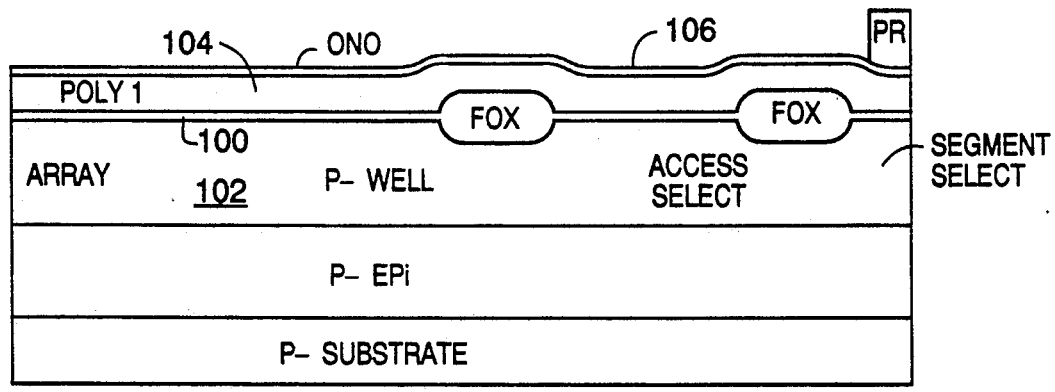
Figure 2D:
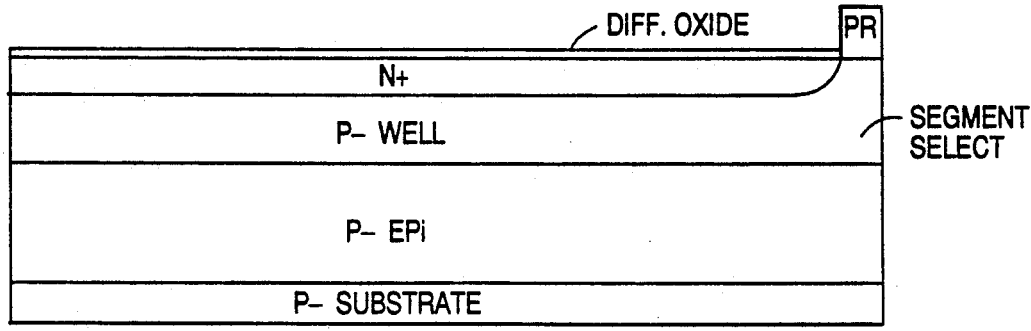

Referring to FIG. 2, after stripping the Poly1 photoresist mask 108, a thin edge oxide is grown between the Poly1 strips 110 and a bit line mask is defined to protect the segment select regions of the substrate from bit line implant. The Poly1 lines in the array are then used in a self-aligned arsenic implant to define N+ bit lines in the array. Alternate buried N+ bit lines define drain lines that are adjacent buried N+ source lines. Each of the N+ drain lines is contacted by metal in segmented fashion, i.e. one contact for every 32 or 64 cells, for example, in a given column of the array. The intermediate source bit lines are uncontacted.

Next, a "differential" oxide is grown over the N+ bit line areas to provide substantial latitude in subsequent ONO and/or poly plasma etch steps. If, for example, a poly plasma etch is performed without formation of the differential oxide, then the poly plasma etch step could lead to the "trenching" of silicon in the exposed N+ bit line areas. For this reason, this step contributes to the equivalent oxide loss during ONO etch and is, hence, called differential oxidation.

Figure 3:
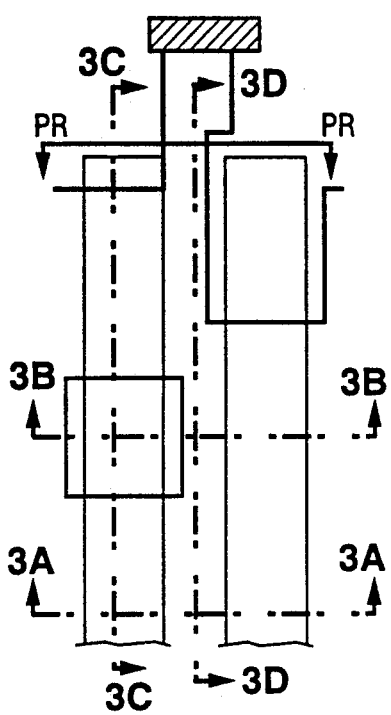
Figure 3A:
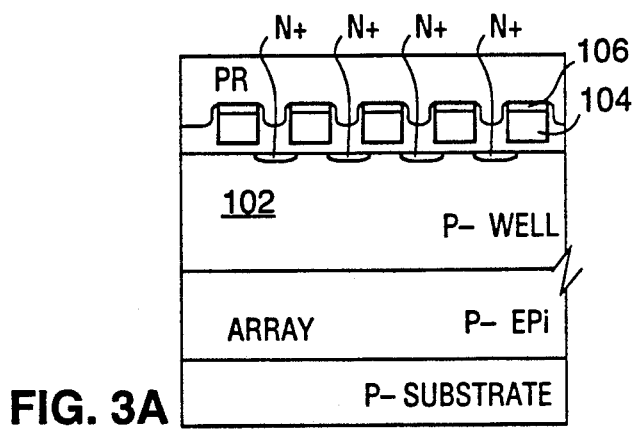
Figure 3B:
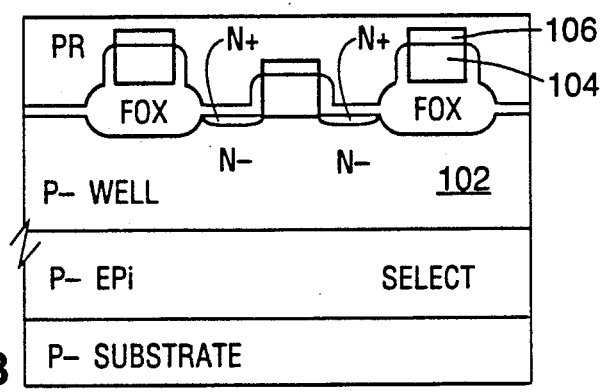
Figure 3C:
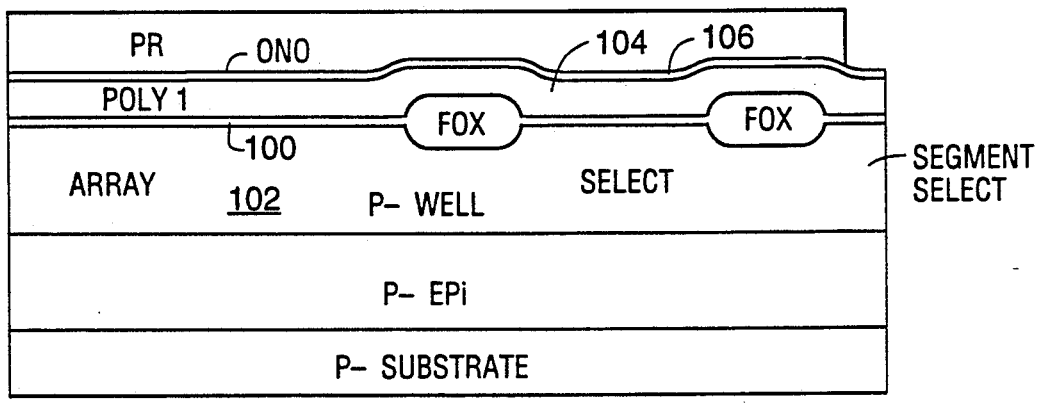
Figure 3D:
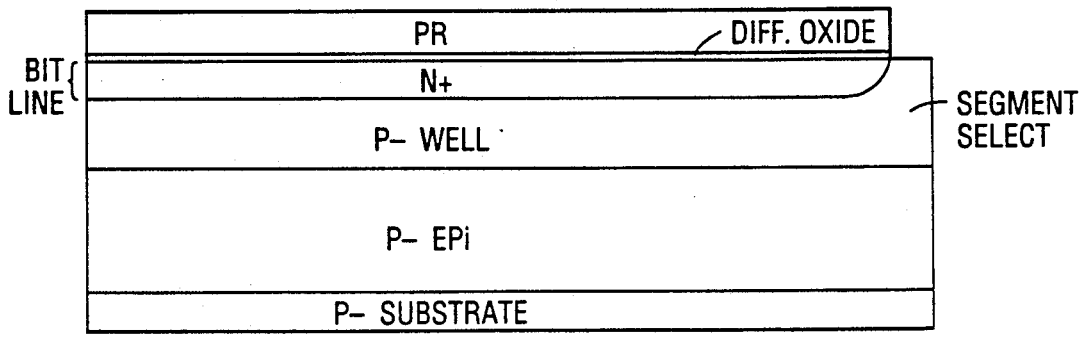

Next, as shown in FIG. 3, a mask step called "protect array" is performed to etch away, out of the array, residual floating gate oxide (the Poly1 mask is a clear field mask) and differential oxide in the segment select areas. Next, the residual floating gate oxide in the periphery and differential oxide in the segment select line areas is etched off in wet chemistry utilizing diluted HF. Then, the photoresist is stripped.

Figure 4:
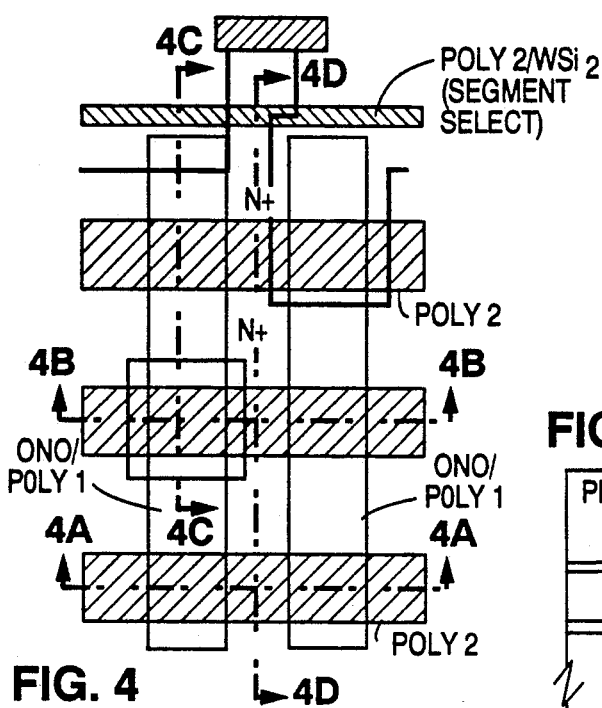
Figure 4A:
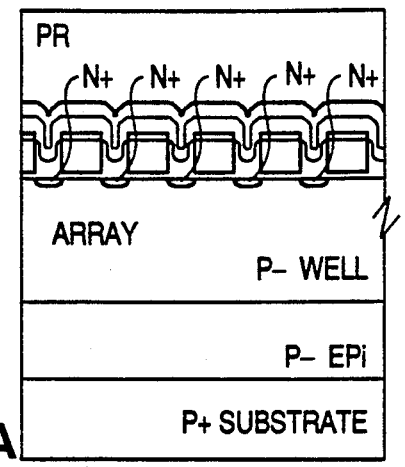
Figure 4B:
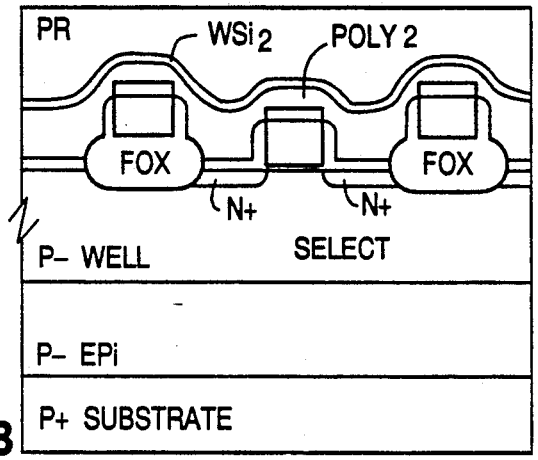
Figure 4C:
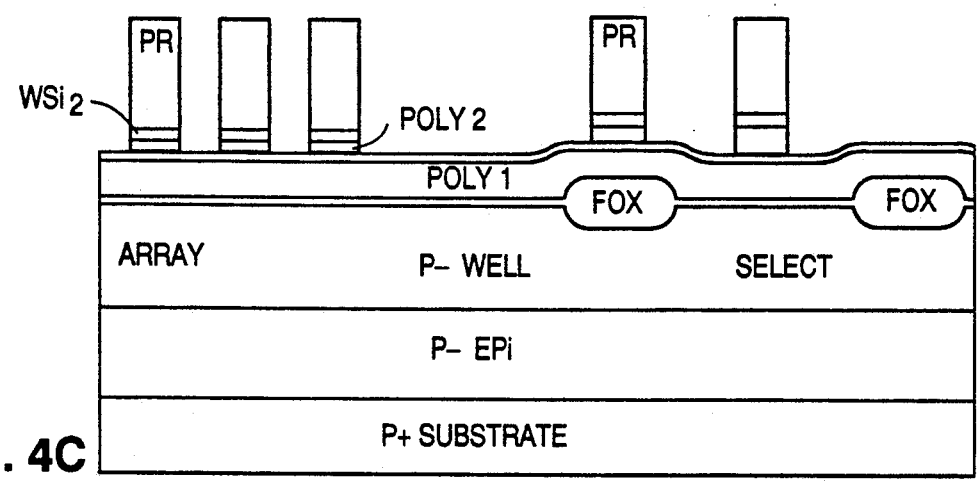
Figure 4D:
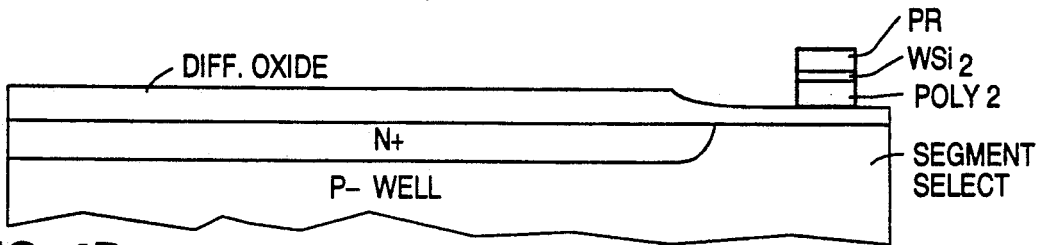

Referring now to FIG. 4, the next step in the process involves the growth of 200 Å gate oxide everywhere in the gate channel regions in the periphery and in the segment select transistor areas. A threshold voltage mask ($V_{tp}$ mask) is then defined and P-channel regions are boron implanted to provide the desired threshold voltage.

After $V_{tp}$ mask photoresist strip, a second layer of 2,000 Å polysilicon (Poly2) is deposited and doped with phosphorous. Then, a 2,500 Å tungsten silicide layer is deposited and a Poly2 mask is defined. The Poly2 mask has multiple functions: defining the gates of the transistors in the periphery, defining the word lines of the EPROM cells, defining first and second access select lines for each segment of the array, and, in accordance with the present invention, defining segment select lines for each segment of the array.

Next, the tungsten silicide layer and the Poly2 layer are plasma etched. It is noted that the access transistors are EPROM cells with larger width than the array EPROM cells to drive larger current than the array cells.

Figure 5:
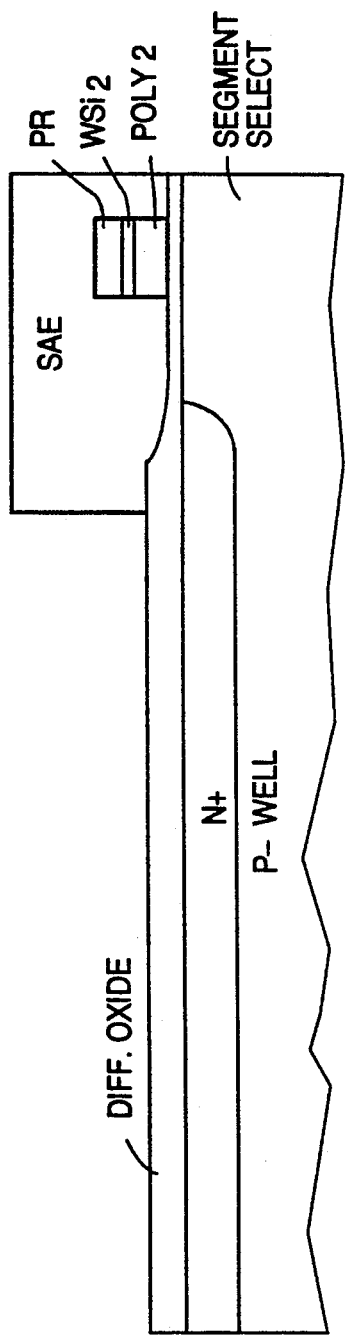

Referring to FIG. 5, after this plasma etch, the photoresist is not stripped. A second photoresist is spun on and a self-aligned etch (SAE) masking step is performed. The SAE mask maintains the integrity of the photoresist of the preceding Poly2 mask in order to allow self-aligned etch to Poly2 of the residual ONO/Poly1 layer between the word lines in the flash EPROM cell array. The SAE mask is formed to also protect the segment select line areas during the ONO/Poly1 etch.

Figure 6:
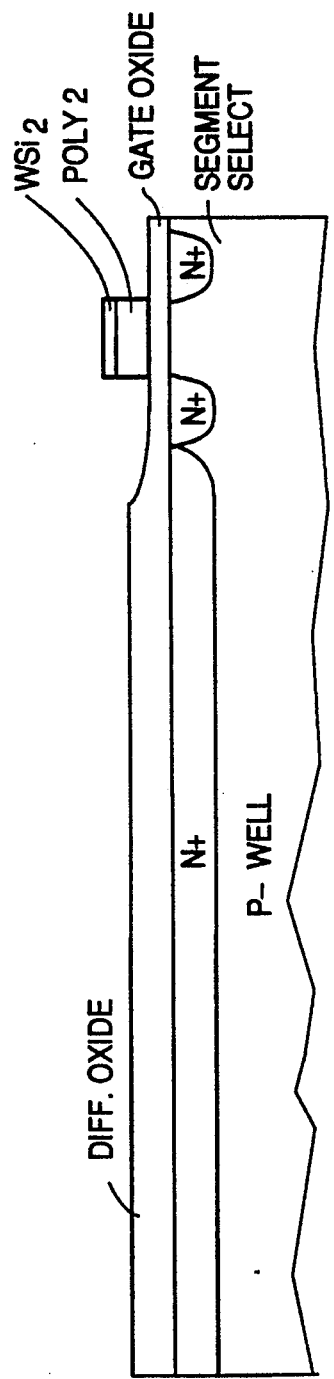

After the ONO/Poly1 etch, the SAE mask is removed and a new mask is defined to enable definition of the N+ source and drain regions of the segment select transistors associated with each of the N+ source lines in the array, as shown in FIG. 6.

Figure 7:
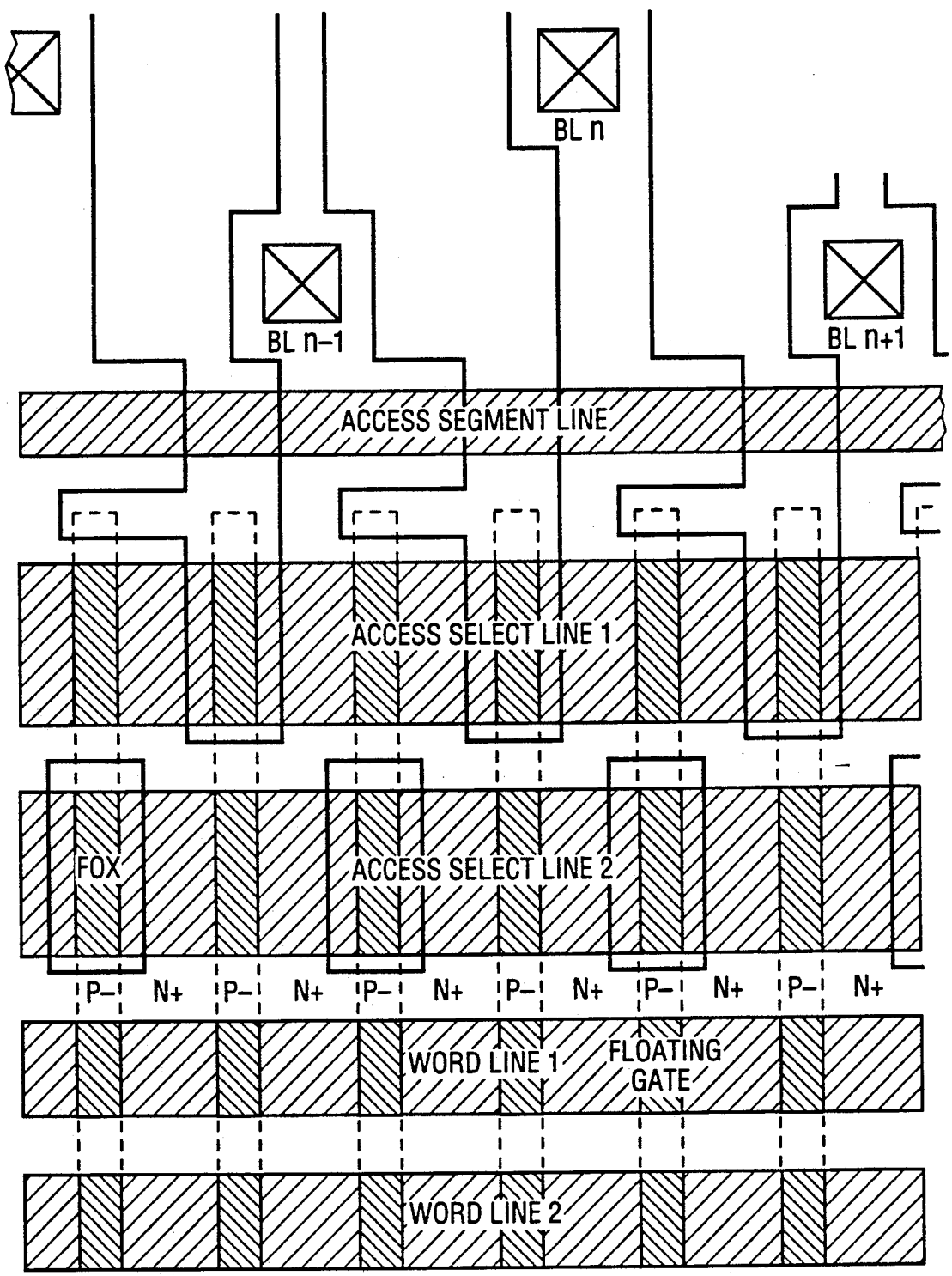
FIG. 7 is a layout illustrating a portion of a fast access EPROM array in accordance with the present invention.
Figure 8:
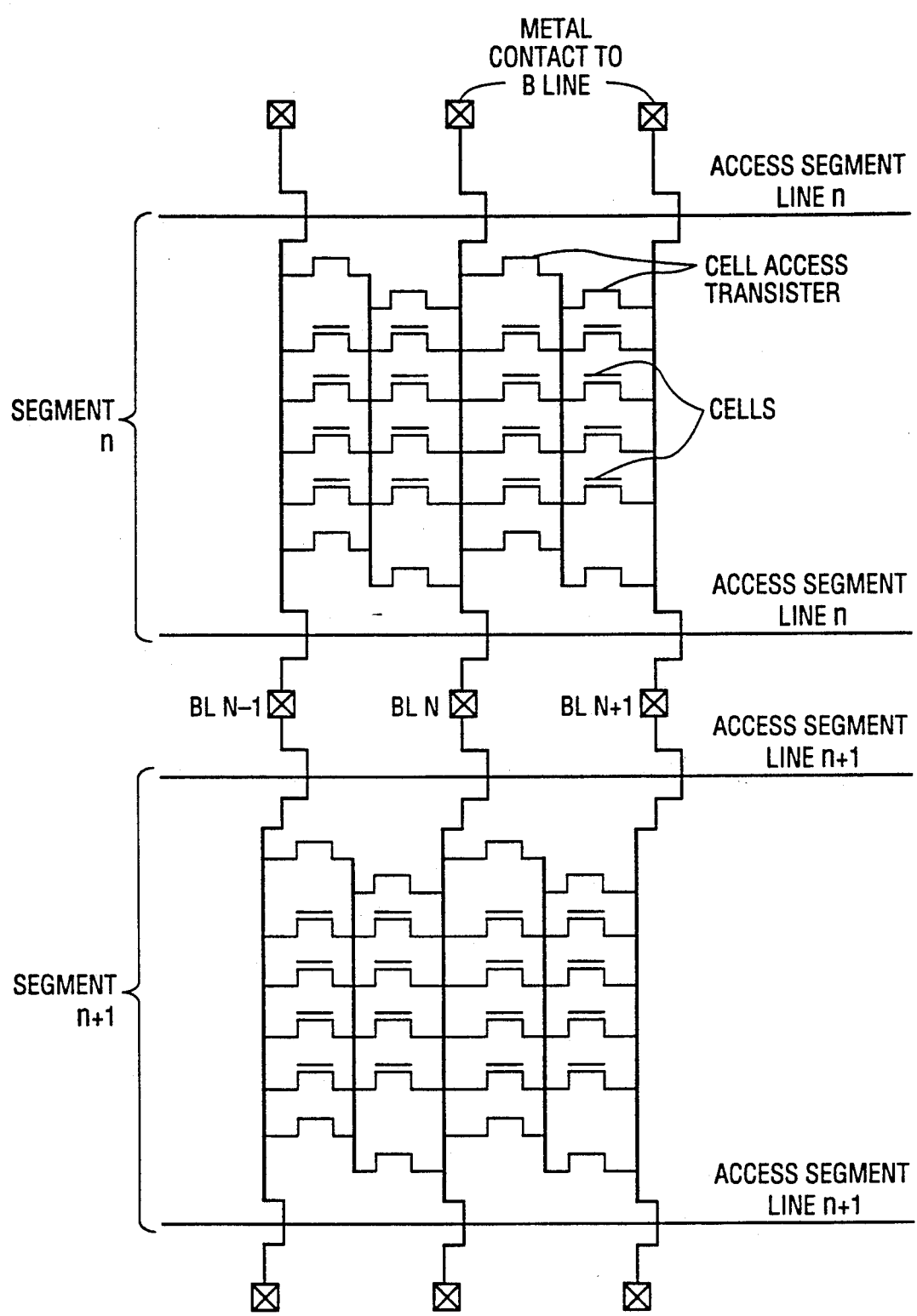
FIG. 8 is a schematic diagram illustrating two segments of a fast access EPROM array in accordance with the present invention.

FIG. 7 shows a layout of the resulting structure, with FIG. 8 providing an equivalent schematic diagram for two segments in the array.

Figure 9:
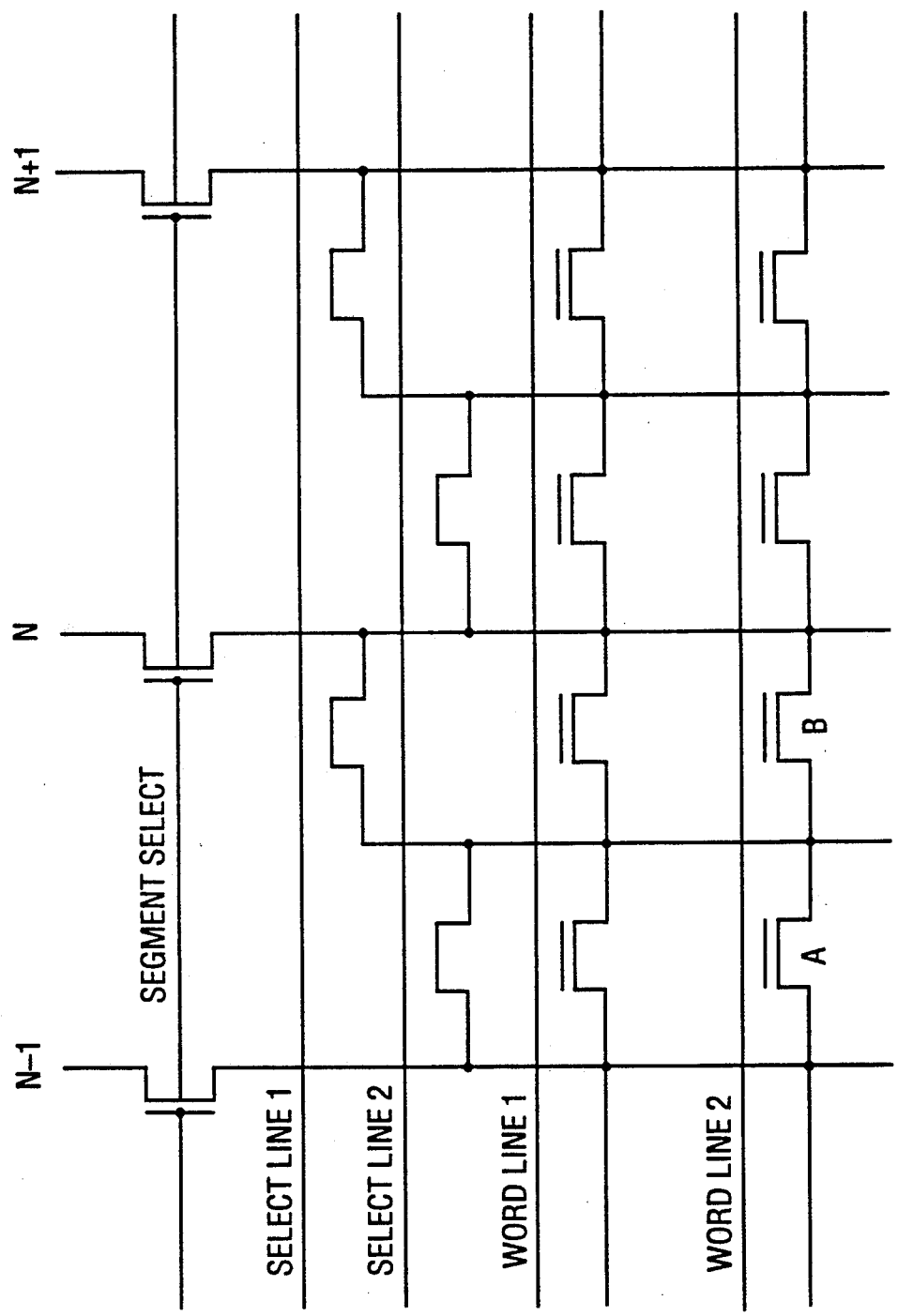
FIG. 9 is a schematic diagram illustrating an equivalence circuit for the FIG. 7 layout.

Referring to FIG. 9, which shows a portion of one segment of an EPROM array in accordance with the present invention, to program cell A, with word line 2 at Vpp and the segment select lines for that segment at the programming voltage Vpp, bit line N−1 is taken to the supply voltage Vcc (5–7 V), bit line N is held at Vss, and bit line N+1 is allowed to float; the programming voltage Vpp is applied to select line 1, while select line 2 is held at Vss. This drives Vss on the intermediate drain bit line, which, as stated above, is non-contacted. This regime causes hot electron injection from the drain side to the floating gate of cell A.

Similarly, to program cell B, with word line 2 and the segment select lines at Vpp, bit line N−1 is held at Vss, bit line N is taken to Vcc, and bit line N+1 is allowed to float; the programming voltage Vpp is applied to select line 2, while select line 1 is held at Vss.

To read cell A, the segment select lines of the selected segment are held at Vcc, and all bit lines of the selected segment are precharged to a read voltage Vrd (1.5–2 V). Select line 1 is held at Vcc and select line 2 is held at Vss. Then, bit line N is pulled down to Vss, bringing the intermediate source to Vss. All other segment select lines are held at Vss.

Similarly, to read cell B, the segment select lines are held at Vcc and all bit lines in the segment are precharged to the read voltage Vrd. Select line 2 is held at Vcc and select line 2 is held at Vss. Then, bit line $BL_{N-1}$ is pulled down to Vss, bringing the intermediate source to Vss. Select line 2 is held at Vcc and select line 2 is held at Vss.

As stated above during reading, only one segment of the array is precharged. This lowers the bit line capacitance to the capacitance of only one segment plus an aluminum bit line, further increasing read access speed.

For example, if a bit line has a total of 1,024 cells and each segment has 64 cells, then read isolation of a segment using the segment select lines reduces bit line capacitance by a factor of 16.

It should be understood that various alternatives to the embodiments of the invention described herein may be employed in practicing the invention. It is intended that the following claims define the scope of the invention and that methods and structures within the scope of these claims and their equivalents be covered thereby.

What is claimed:

1. A method of fabricating a fast access EPROM array in a silicon substrate of P-type conductivity, the method comprising:
   (a) forming a layer of first insulating material on the silicon substrate;
   (b) forming a layer of first conductive material on the first insulating material;
   (c) forming a layer of second insulating material on the layer of first conductive material;
   (d) etching selected portions of the layer of second insulating material and underlying first conductive material to form a plurality of spaced-apart parallel strips of second insulating material and underlying first conductive material;
   (e) introducing N-type dopant into the silicon substrate regions between the parallel strips of second insulating material and underlying first conductive material to formed space-apart buried N+ bit lines, alternate buried N+ bit lines forming drain lines that alternate with buried N+ source lines, each of the drain lines having only one electrical contact for a plurality of EPROM cells sharing said drain line such that the EPROM array is subdivided into a plurality of segments, the source lines being uncontacted;
   (f) forming a plurality of spaced-apart parallel word lines of second conductive material, said word lines formed perpendicular to the strips of second insulating material and underlying first conductive material and such that the second conductive material is separated from the first conductive material by the second insulating material whereby the intersection of the first and second conductive material defines the location of a cross-point EPROM cell of the array;
   (g) forming first and second spaced-apart parallel select lines of second conductive material in each segment of the array said select lines formed perpendicular to the strips of second insulating material and underlying first conductive material and such that the second conductive material is separated from the first conductive material by the second insulating material whereby the intersection of the first and second select lines with the first conductive material defines the location of first and second select transistors such that each buried N+ source line is electrically connectable to one of its adjacent drain lines via the first select transistor having its gate provided by the first select line and to the other adjacent drain line via a second select transistor having its gate provided by the second select line;
   (h) forming first and second segment select lines in each segment of the array, said segment select lines defining the gate of a segment select transistor associated with each drain line.

* * * * *